(12) United States Patent
O'Toole et al.

(10) Patent No.: US 9,887,004 B2
(45) Date of Patent: Feb. 6, 2018

(54) BI-DIRECTIONAL RRAM DECODER-DRIVER

(71) Applicant: HGST Netherlands B.V., Amsterdam (NL)

(72) Inventors: James Edwin O'Toole, Boise, ID (US); Ward Parkinson, Boise, ID (US); Daniel Robert Shepard, North Hampton, NH (US); Thomas Michael Trent, Tucson, AZ (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/194,678

(22) Filed: Jun. 28, 2016

(65) Prior Publication Data

US 2017/0372781 A1 Dec. 28, 2017

(51) Int. Cl.
| | | |
|---|---|---|
| *G11C 13/00* | (2006.01) | |
| *H01L 45/00* | (2006.01) | |
| *H01L 27/24* | (2006.01) | |
| *G11C 11/00* | (2006.01) | |

(52) U.S. Cl.
CPC ......... *G11C 13/0069* (2013.01); *G11C 11/00* (2013.01); *G11C 13/0004* (2013.01); *G11C 13/0007* (2013.01); *G11C 13/0023* (2013.01); *H01L 27/2427* (2013.01); *H01L 27/2463* (2013.01); *H01L 45/085* (2013.01); *H01L 45/1233* (2013.01); *H01L 45/146* (2013.01)

(58) Field of Classification Search
CPC . G11C 11/00; G11C 13/0069; G11C 13/0007; G11C 13/0004; G11C 13/0023; H01L 27/2463; H01L 45/1233; H01L 45/146; H01L 27/2427; H01L 45/085
See application file for complete search history.

(56) References Cited

U.S. PATENT DOCUMENTS

| | | | |
|---|---|---|---|
| 8,194,433 B2 | 6/2012 | Parkinson | |
| 8,780,607 B2 | 7/2014 | Wells et al. | |
| 2009/0046496 A1* | 2/2009 | Katoh | G11C 11/5685 365/148 |
| 2010/0118590 A1 | 5/2010 | Carter et al. | |
| 2012/0085985 A1* | 4/2012 | Yang | B82Y 10/00 257/9 |
| 2012/0287706 A1* | 11/2012 | Lung | H01L 45/06 365/163 |
| 2014/0209892 A1 | 7/2014 | Kuo et al. | |
| 2014/0293674 A1 | 10/2014 | Johnson | |
| 2015/0074326 A1* | 3/2015 | Castro | G11C 13/0004 711/101 |
| 2015/0103578 A1 | 4/2015 | Yip | |
| 2015/0332762 A1 | 11/2015 | Lee et al. | |

OTHER PUBLICATIONS

Cha, et al.; Selector Devices for 3-D Cross-Point ReRam; Circuits and Systems (ISCAS); dated Jun. 1-5, 2014; 1 page.

\* cited by examiner

*Primary Examiner* — Harry W Byrne
*Assistant Examiner* — Ajay Ojha
(74) *Attorney, Agent, or Firm* — Patterson + Sheridan LLP

(57) ABSTRACT

The present disclosure generally relates to the fabrication of and methods for creating a reversible tri-state memory device which provides both forward and reverse write and read drive to a bi-directional RRAM cell, thus allowing writing in the forward and reverse directions. The memory device, however, utilizes a single transistor "on pitch" which fits between two metal lines traversing the array tile.

18 Claims, 4 Drawing Sheets

BI-DIRECTIONAL RRAM DECODER-DRIVER

BACKGROUND OF THE DISCLOSURE

Field of the Disclosure

Embodiments of the present disclosure generally relate to data storage and computer memory systems, and more particularly to a reversible tri-state memory device and accessing bi-directional memory devices.

Description of the Related Art

As electronic memories approach limits beyond which they will no longer be able to produce the density, cost, or performance improvements necessary, a host of memory technologies are being investigated as potential replacements for conventional silicon complementary metal oxide semiconductor (CMOS) integrated circuit memories.

Among the memory technologies being investigated are a number of bi-directional memory technologies: memories that exploit a directional characteristic of the material used to program or read a memory device. Conventional memory devices typically associate one of two memory states with the presence or absence of charge, or with a high or low voltage. In such conventional memories, memory states are associated with uni-directional characteristics; charge is either present or not (e.g., DRAM, FLASH) or a node is held at a high or low voltage (e.g., SRAM). There is no sense of "direction" to such storage mechanisms. In contrast, bi-directional memories employ some directional aspect of their memory material to store binary information. For example, one memory state may be written by forcing a current through a bi-directional memory device in one direction or applying a voltage of one polarity, and another memory state may be written by forcing a current through the same device in the opposite direction or applying a voltage of the opposite polarity. The programmed memory states may then be sensed by, for example, applying to the memory device either a voltage to measure current related to memory state, or forcing a current through and measuring a voltage related to memory state.

Bi-directional memory types include resistive random access memories and magneto-resistive random access memories (both referred to as RRAM), programmable metallization cells, Pnictide phase change memories, polymer memories, ferro-electric random access memories (FeRAM), ionic memory devices and metal nano-particle memory cells.

A RRAM cell may be programmed, respectively, to high resistance and low resistance values by applying electric pulses of opposite polarities to a cell. The cell's high and low resistance values are employed to represent two different memory states.

Programmable metallization cells utilize electrochemical control of nanoscale quantities of metal in thin films of solid electrolyte. Information is stored via electrical changes caused by the oxidation of a metal and reduction of metal ions in the solid electrolyte. Such an electrical change may be induced by applying a small electrical bias to a cell. A reverse bias will reverse the oxidation until the electrode-posited or electro-plated metal has been removed, thereby returning the cell to the original memory state.

Polymer memories exhibit electrical bistability involving an increase in conductivity when a bias voltage of sufficient magnitude is applied to a cell. The cell may be returned to a low conductivity state by applying a bias voltage of the opposite polarity to the device.

Bi-directional memory cells may be arranged in rectangular arrays in which individual memory cells are located at the intersection of row and column address lines, where one line is placed above the other. Individual cells are accessed (that is, read from or written to) by asserting the row address line and column address line that uniquely define a cell's location within the array. Or, for greater bandwidth, more than one column may be selected in parallel onto one row line, where each column line has separate read and write circuitry. Although an individual cell may be uniquely addressed by assertion of a row and column address line pair, because a plurality of memory cells share a row address line and a plurality of cells share a column address line (cells do not share row and column address lines), a plurality of cells may be "partially" selected by the assertion of a row or column address line.

Bi-directional RRAM non-volatile memory (NVM) requires write with forward and reverse voltages applied across the selected memory element. In a minimum cross-point cell architecture, to write or read in the forward direction, an X-select word line is taken high to a positive power supply $V_P$, and a Y-select bit line is taken low, such as to ground. To write or read in the reverse direction, the word line is taken low and the bit line is taken high.

With a minimum cell area approach, such as a cell with a width equal to F in the X-direction, and a width equal to F in the Y-direction, the area is $4F^2$, where F is the minimum dimension for a given fabrication photo area. The alternate even numbered word line wires are driven on the top of the tile and the alternate off numbered word lines are driven on the bottom of the tile. Similarly, the alternate odd and even numbered bit line wires are driven on the left and right side of the tile. With such an approach, the dense wires may extend from the array tiles with one of two extended and connected to the driver, and one of two terminated to make additional room for the wire line driver circuitry. With one or two transistors stacked per wire, sets of transistors are stacked to fit drive transistors adjacent the tile array. If the drive is in one direction only, the transistors "on pitch" may be n-channel only with one (or two) transistor(s) driving a given bit line, or one (or two) p-channel transistor(s) driving a given word line. An interconnect with separate gate drive to the n-channel and separate gate drive to the p-channel can be challenging without extra metal layers and area for the contacts and vias. Extra metal layers substantially add to wafer cost and finished product costs.

Typical drive approaches include a single n-channel transistor on each side of a tile with a decoded gate that goes above the write power supply, or a single n-channel transistor on the two bit line drive sides of the tile and a single p-channel transistor on the two word line drive sides of the tile. These approaches, however, perform best in the forward direction. In the reverse direction, the drive voltage is reduced by two transistor $V_t$ and two transistor $V_{on}$ (or >4V), where the $V_t$ is greater as the source is volts away from the substrate (n-channel) or p-well (p-channel). The voltage delivered to the cell in the forward direction is reduced mostly by the IR drop in the metal lines and less by loss in the driver transistors.

Therefore, what is needed in the art is an improved memory device and method for creating such memory device. More specifically, what is needed in the art is a memory device which provides both forward and reverse write and read drive to a bi-directional RRAM cell to allow writing in the forward and reverse directions without added drops across the transistor select drivers on the metal word and bit lines.

SUMMARY OF THE DISCLOSURE

The present disclosure generally relates to the fabrication of and methods for creating a reversible tri-state memory device which provides both forward and reverse write and read drive to a bi-directional RRAM cell, thus allowing writing in the forward and reverse directions. The memory device, however, utilizes a single transistor "on pitch" which fits between two metal lines traversing the array tile.

In one embodiment, a method for creating an inverter is disclosed. The method includes selecting a word line HIGH, and applying a first voltage to a first inverter line to bring the first inverter line to ground. The first voltage causes the word line to be brought to LOW. The method further includes selecting a bit line LOW, and applying a second voltage to a second inverter line to bring the second inverter line to HIGH. The second voltage causes the bit line to be brought to HIGH.

In another embodiment, a method for creating an inverter is disclosed. The method includes selecting a word line HIGH via a current source, and applying a first voltage to a first inverter line coupled to the word line to bring the first inverter line to ground. The first voltage causes the word line to be brought to LOW. Furthermore, the first voltage turns on an ovonic threshold switch (OTS) disposed between the word line and first inverter line.

In another embodiment, a method for creating an inverter is disclosed. The method includes selecting a word line LOW via a current source, and applying a first voltage to a first inverter line coupled to the word line to bring the first inverter line to ground. The first voltage causes the word line to be brought to HIGH. Furthermore, the first voltage turns on an ovonic threshold switch (OTS) disposed between the word line and the first inverter line.

In another embodiment, a reversible tri-state memory device is disclosed. The reversible tri-state memory device includes a word line, a bit line disposed perpendicular to the word line, and a memory element disposed between the word line and the bit line. The reversible tri-state memory device further includes a select element coupled to the memory element, a first inverter line coupled to the word line, and a second inverter line coupled to the bit line. The select element is disposed adjacent the word line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to the fabrication of and methods for creating a reversible tri-state memory device which provides both forward and reverse write and read drive to a bi-directional RRAM cell, thus allowing writing in the forward and reverse directions. The memory device, however, utilizes a single transistor "on pitch" which fits between two metal lines traversing the array tile.

A bi-directional memory cell in accordance with the present disclosure includes a bi-directional threshold device, such as an ovonic threshold switch (OTS), and a bi-directional memory element. The bi-directional threshold device in series with the memory element isolates the bi-directional memory element from surrounding circuitry and to thereby prevent inadvertent accesses to the memory element, for read or write.

Figure 1:
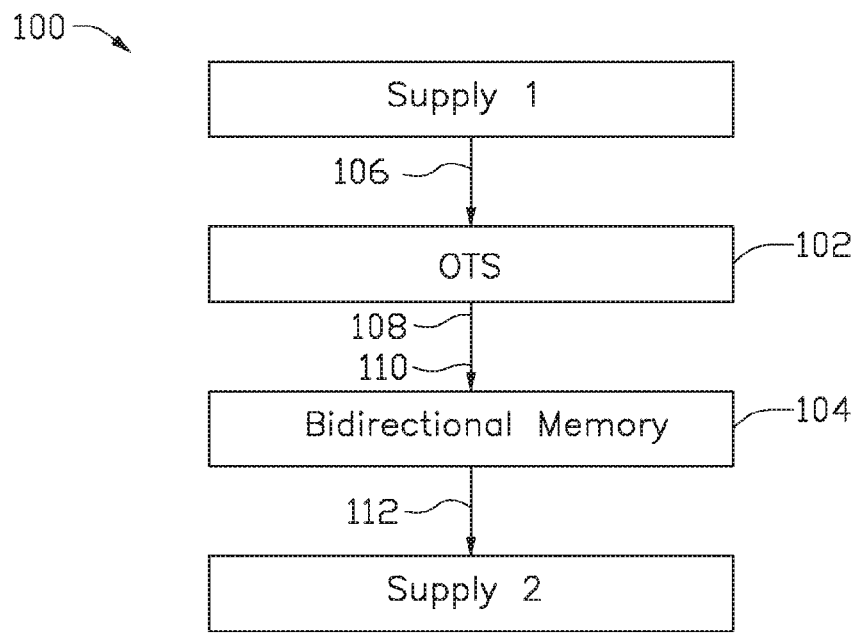
FIG. 1 is a schematic diagram of a conceptual block diagram of a bi-directional writing memory cell, according to one embodiment described herein.

FIG. 1 schematically illustrates a conceptual block diagram of a bi-directional writing memory cell 100. The bi-directional writing memory cell 100 includes an OTS 102 connected in series with a bi-directional memory element 104. Use for unidirectional writing memory cell will be apparent to those reasonably skilled in the art. One or more OTS 102 is coupled at a first terminal 106 to a first supply SUPPLY1 and at a second terminal 108 to a first terminal 110 of the bi-directional memory element 104. It is contemplated, however, that in some embodiments, the bi-directional memory element 104 may be coupled at the first terminal 110 to the first supply SUPPLY1 and at a second terminal to the first terminal 106 of the OTS 102. As such, the OTS 102 and the memory element 104 may be swapped in location. Bi-directional refers to the writing of the memory element; however, certain memories may also be read in either or both directions. The bi-directional memory element is coupled to a second supply SUPPLY2 through a second terminal 112.

SUPPLY1 and SUPPLY2 may be coupled to respective terminals of the memory cell 100 through and under control of circuitry, such as decoding circuitry. The supplies, SUPPLY1 and SUPPLY2, may be configured as current supplies or voltage supplies and may include both current and voltage supplies.

Additionally, in order to satisfy the demands of the bi-directional memory element 104, each of the supplies, SUPPLY1 and SUPPLY2, are bi-directional. That is, each supply may be of a "positive" or "negative" voltage (polarities are a matter of convention) or each supply may source or sink current, for example. In different embodiments, the bi-directional aspect of the supplies may be implemented by switching various positive elements (e.g. corresponding to a positive voltage or sourcing a current) and negative elements (e.g. corresponding to a negative voltage or sinking a current) into or out of the supply circuit.

Figure 2:
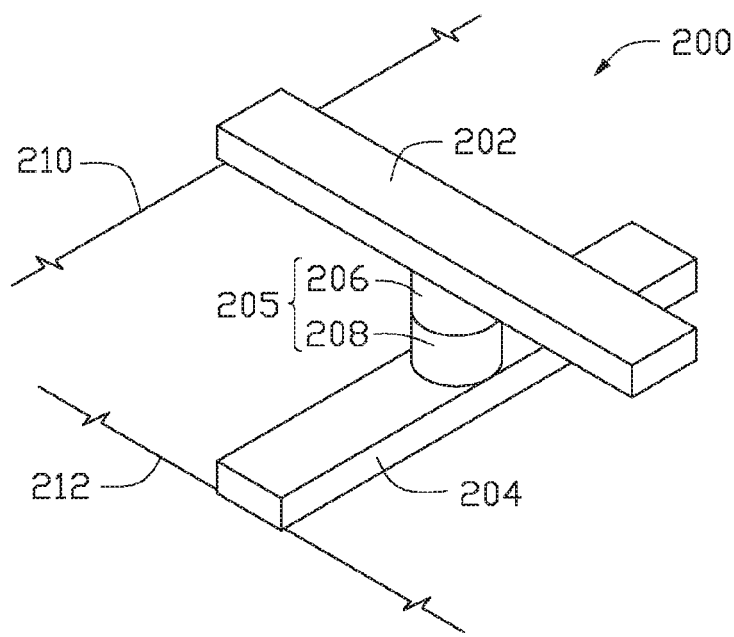
FIG. 2 is a schematic diagram of a reversible tri-state memory device, according to one embodiment described herein.

FIG. 2 schematically illustrates a reversible tri-state memory device 200. The reversible tri-state memory device 200 includes a word line 202 and a bit line 204. The bit line 204 is disposed perpendicular to the word line 202. As described with reference to FIG. 1, the reversible tri-state memory device 200 of FIG. 2 also includes a memory cell 205. The memory cell 205 may be substantially similar to memory cell 100. In some embodiments, the memory cell 205 includes a memory element 206 and a select element 208. The memory element 206 is disposed between the word line 202 and the bit line 204. The select element 208 is coupled to the memory element 206. In some embodiments, the select element 208 is disposed adjacent the word line 202, and in other embodiments, the select element 208 is disposed adjacent the bit line 204. As such, the memory element 206 and the select element 208 within the memory cell 205 may be sequenced in any order (e.g., swapped). The reversible tri-state memory device 200 further includes a first inverter line 210 coupled to the word line 202 and a second inverter line 212 coupled to the bit line 204. In some embodiments, the memory element 206 is a Resistive Random Access Memory (RRAM) device. Furthermore, in some embodiments, the memory element 206 is in series with the select element 208.

It is further contemplated, that in some embodiments, the RRAM may be inverted if necessary to layer up each memory cell 205. Furthermore, in certain embodiments, the layering may include embodiments in which the word lines 202 and the bit lines 204 are shared between memory cells 205 as well as embodiments in which the word lines 202 and the bit lines 204 are not shared between memory cells 205. When shared between memory cells 205, odd layers may include the memory element, for example, RRAM, which is pointing downward, while even layers include the memory element, for example, RRAM, which is pointing upward (i.e., reversed direction).

In some embodiments, the select element 208 is an ovonic threshold switch (OTS), a doped chalcogenide alloy material, a thin film silicon material, a metal-metal oxide switch, or a Field Assisted Superlinear Threshold selector (FAST). Chalcogenide materials generally include a chalcogen element and one or more chemical or structural modifying elements. The chalcogen element (e.g., Te, Se, S) is selected from column VI of the periodic table and the modifying elements may be selected, for example, from column III (e.g., Ga, Al, In), column IV (e.g., Si, Ge, Sn), or column V (e.g., P, As, Sb) of the periodic table. The role of modifying elements includes providing points of branching or crosslinking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Chalcogenide materials may also be the resultant of a reactive sputtering process: a chalcogenide nitride, or oxide, for example and chalcogenide may be modified by an ion implantation or other process. In certain embodiments, the select element 208 may comprise an undoped polysilicon material.

Figure 3:
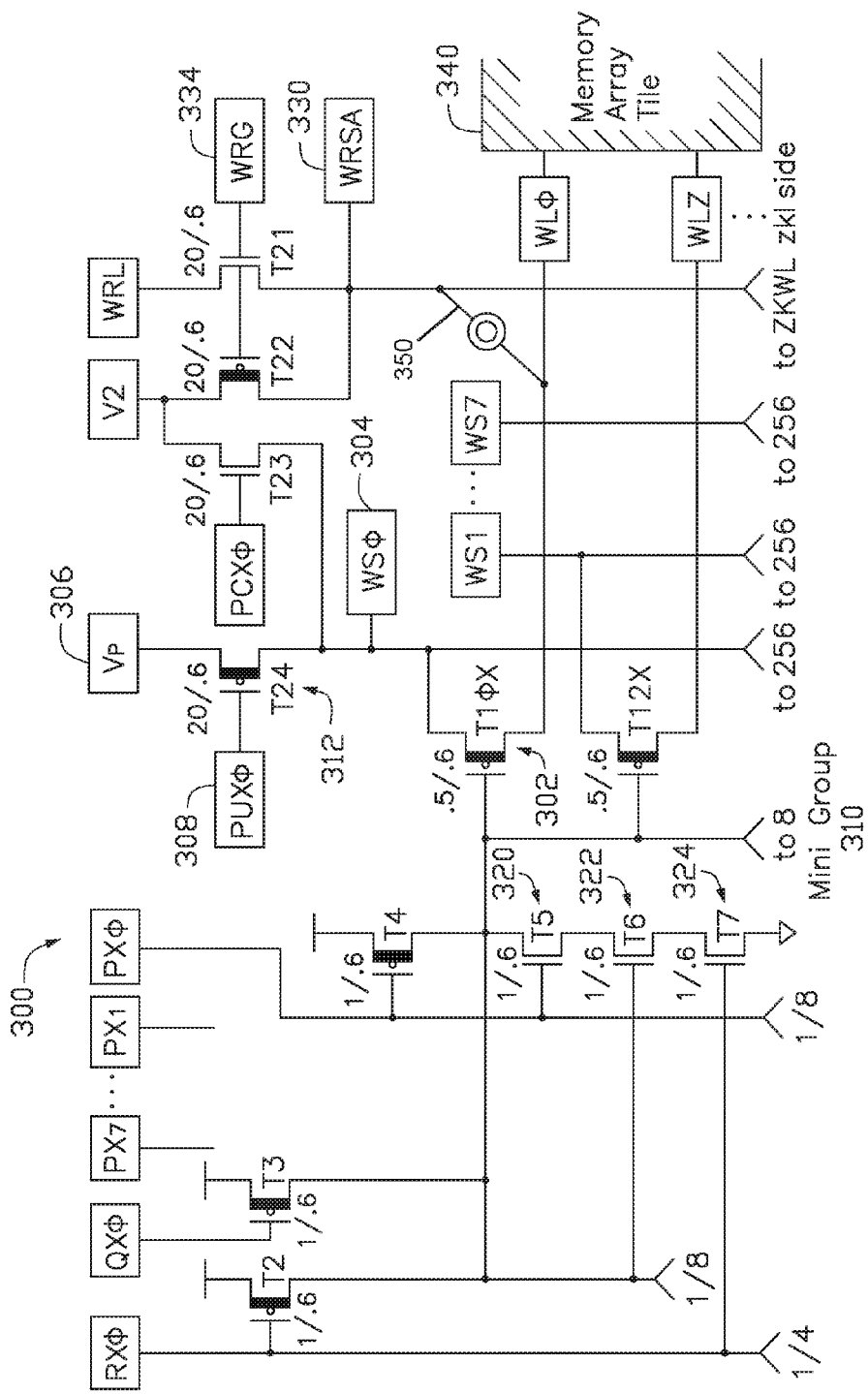
FIG. 3 and FIG. 4 are each a schematic circuit diagram of a bi-directional RRAM row and column decoder, according to embodiments described herein.
Figure 4:
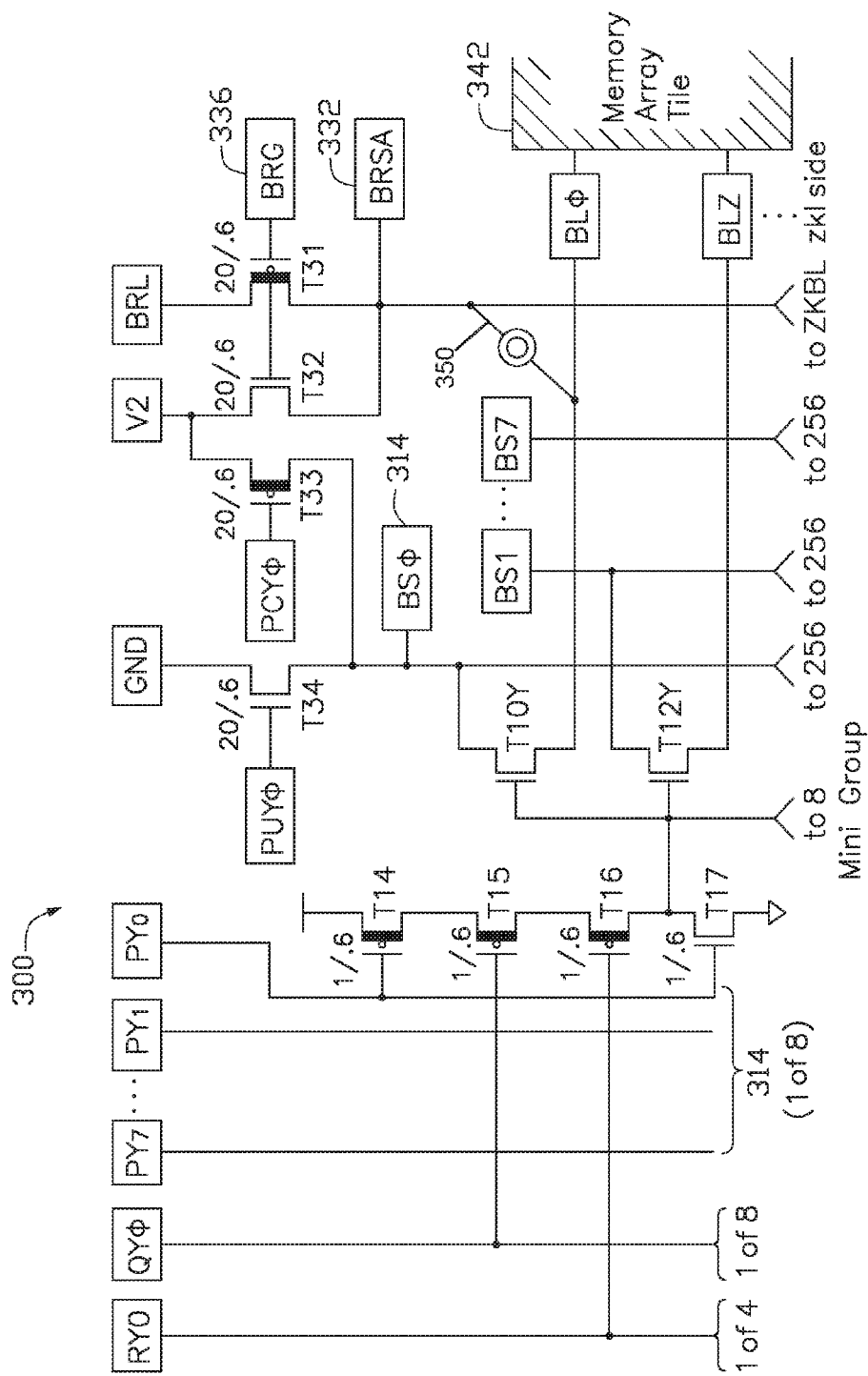

FIGS. 3 and 4 are each schematic circuit diagrams of a bi-directional RRAM row and column decoder 300. The bi-directional RRAM row and column decoder 300 may be utilized to form an inverter, where FIG. 3 demonstrates various aspects of the present disclosure, including a write operation, and in accordance with the configuration(s) as depicted therein, with at least one word line being driven by a positive voltage Vp, and where FIG. 4 demonstrates various aspects of the present disclosure, including a read operation, and in accordance with the configuration(s) as depicted therein, with at least one bit line being driven to a low, such as ground GND. As shown in FIG. 3, a T1 drain 302 is driven by WSφ 304 to a positive write voltage 306, $V_P$, such as by a wide drive transistor T24 312 when PUXφ 308 goes low to select one of eight drive transistors 304. Eight wires may be disposed therein to connect to the eight T1 with gates shorted together, the one of eight T1 in the eight transistor mini-group 310 selected by which WSφ-7 wire goes high.

Similarly, in FIG. 4, BSφ 316 (1 of 8 BSn) wires through the bit line decoder/driver goes to low, thus selecting the bit at the X-Y intersection of the uniquely high X wire and uniquely low Y wire. As such, the OTS 350 in the memory cell is triggered on. Triggering the OTS 350 on allows access to the series RRAM memory element in the selected memory element for writing or reading in the forward direction.

The selected T1nX gate is at ground through the series n-channel transistors T5 320, T6 322, and T7 324 being turned on via the pre-decoded address lines into the Nand decoder of FIG. 3. Similarly, the selected T1nY is turned on via the pre-decoded address lines into the NOR decoder of FIG. 4. As considerable gate $V_{on}$ voltage for both the p-channel word line pull-up transistor and the n-channel bit line pull-down transistor is applied, a minimum drain-source voltage results. As such, most of the power supply is available for voltage at the cell, which is reduced only by the drive transistor drain-source voltage and IR drop along the X and Y select wires to the bit.

Upon ending a write cycle, or a read cycle at lower $V_p$, the drain of the T1nX and drain of the T1nY are driven to $V_p/2$ (labeled "V2") which restores the selected word line and bit line to the selected voltage of V/2. The restoration may be performed through transistor PCXn with drain to V2, source to WSn for the word line, and via PCYn with drain to V2, source to BSn for the bit line.

To write with reversed voltage, the sequence described above is followed to select the word line and the bit line, however, current through $V_p$ is limited by a current source, such as by taking PUXφ to $V_p-V_t-V_{on}$ or using a transistor in series to $V_p$. Similarly, current is limited in PUYn by a current source, by lowering gate voltage to $1V_t+V_{on}$ above ground or by placing PUYn transistors in series with a current source to ground. Such current sources may also be utilized to limit current as desired for RRAM in the forward write SET, i.e., a low resistance state (LRS). Current may be limited in the forward direction while selecting by a sequence as follows: select a word line with a current source, turn on a row inverter to pull the word line low, then select a bit line, turn on a bit inverter to pull high. As such, the memory cell is not inadvertently written forward before being written reverse.

Furthermore, to respectively reverse the voltage on the selected word line and/or the selected bit line, a WRSA line 330, shown in FIG. 3, disposed orthogonally across the word line is taken to low (for example, to ground). A BRSA line 332, shown in FIG. 4, disposed orthogonally across the bit line is taken to a positive voltage such as Vp. This turns on an OTS 350 from the WRSA line 330 to the selected word line and an OTS 350 from the BRSA line 332 to the selected bit line. The OTS 350 has lower dynamic resistance than the T1 transistor, and as such, the WRSA line 330 and the BRSA line 332 drive the selected line to the opposite reverse write voltage, as if through an inverter.

At the conclusion of each cycle, the $V_p$ into the drain of PUXn may be taken to V/2. Furthermore, the ground into PUYn may be taken to V/2 as the WRSA line 330 and the BRSA line 332 are taken to V/2. The word line may be driven through T22 with WRG 334 going from high to low. Additionally, the bit line may be driven through T32 with BRG 336 going from low to high.

In order to avoid excess coupling into adjacent wires, the decoder for the adjacent wires to the word line and the bit line, respectively, is disposed at the opposite end of the memory array tile 340, 342. Such decoders may be selected around the selected word line and/or the selected bit line such that the adjacent lines are actively driven to V/2. In order to reduce coupling further, the edge rate applied on the word line and the bit line when selecting and deselecting may be a controlled edge rate in both the forward and reverse write directions by using current sources that increase after selected by the one of 256 decoders, as shown in FIGS. 3 and 4. Such a current source may also be applied on the WRL and the BRL (drains of T21 and T31) to lower the edge and allow less peak before the coupling is dissipated by the hold down of adjacent wires.

To provide margin for selecting the correct OTS 350 of the word line and/or bit line selected, the OTS 350 may be made greater than the write voltage/2, by way of example only, $0.75V_{pp}$, by adjusting thickness. The trigger on voltage may be designed as low as possible with low resistance electrodes and low dynamic resistance to over-power the T1 transistor.

A select transistor may be utilized in the forward direction. To reverse the signal, however, with good drive into the memory array tile select line, a separate wire may be disposed orthogonally above or below the select wire into the tile. The select transistor may be an n-channel or a p-channel, or an n-channel driving the bit line and a p-channel driving the word-line. Furthermore, the select wire may be the word line or the bit line. At each intersection of the wires is placed an Ovonic Threshold Switch (OTS). Word line reverse voltage (WRS) or bit line reverse voltage (BRS) signal driving the orthogonal wire may be taken to an opposite voltage from that of the select transistor. As the voltage between the word line or the bit line and the WRS or the BRS exceeds the OTS threshold, the OTS connects with WRS or the BRS to the array word line or bit line metal wire with low reverse write direction. The result is a tri-state inverter and non-inverting driver in one transistor which fits within the tight pitch without growing the layout by more than a single transistor. As such, the area is comparable to that for a unidirectional write approach, avoiding the traditional drive penalty for RRAM relative to other competing memory element technologies such as PCM or RRAM which are unidirectional write (only apply forward voltage across the memory element to read and write).

Figure 5:
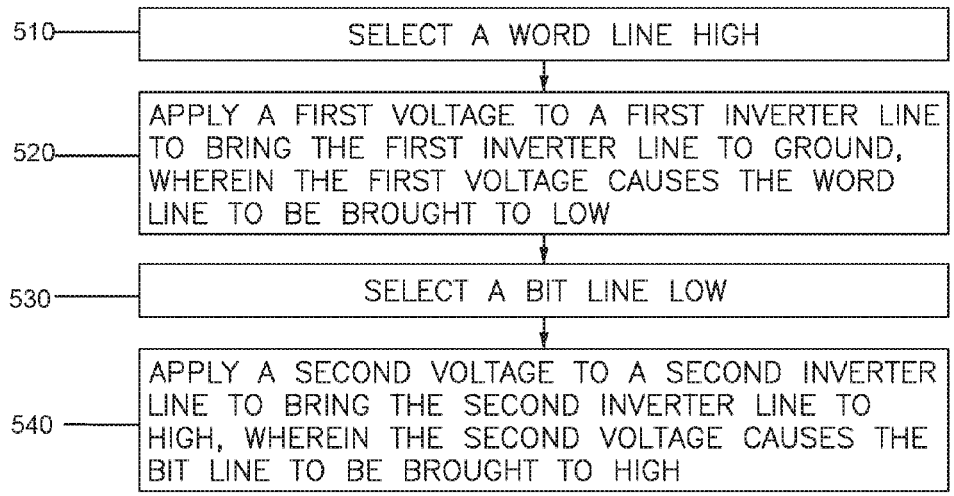
FIG. 5 schematically illustrates operations of a method for creating an inverter, according to one embodiment described herein.

FIG. 5 schematically illustrates operations of a method 500 for creating an inverter. The method 500 may be performed in conjunction with and/or utilizing the reversible tri-state memory device 200 and/or the circuit diagram of the bi-directional RRAM row and column decoder 300, discussed supra.

At operation 510, a word line is selected HIGH.

At operation 520, a first voltage is applied to a first inverter line. In some embodiments, the first inverter line is coupled to the word line. Application of the first voltage brings the first inverter line to ground. Furthermore, application of the first voltage causes the word line to be brought to ground. The application of the first voltage to the first inverter line also causes a filament formation. The filament may be formed within a memory cell. The memory cell may include a RRAM material. In certain embodiments, the RRAM material may be selected from at least one of zinc oxide (ZnO), titanium oxide ($TiO_2$), hafnium oxide ($HfO_2$), tantalum oxide ($TaO_2$), vanadium oxide ($VO_2$), tungsten oxide ($WO_2$), zirconium oxide ($ZrO_2$), copper oxide, nickel oxide, or combinations and mixtures thereof.

Applying the first voltage to the first inverter line further provides a third voltage to an ovonic threshold switch (OTS) coupled with the word line and the first inverter line. In some embodiments, the third voltage is greater than the first voltage. Additionally, the third voltage turns on the OTS coupled with the word line and the first inverter line. The providing of the third voltage may cause a filament formation.

At operation 530, a bit line is selected LOW. In some embodiments, the selection of the bit line LOW may be through an n-channel transistor. In other embodiments, however, the selection of the bit line LOW may be through a p-channel transistor, or any other suitable transistor type.

At operation 540, a second voltage is applied to a second inverter line. Applying the second voltage to the second inverter line includes actively driving the second inverter line to HIGH through a p-channel transistor. The p-channel transistor may be coupled to a power supply via a wired connection. In some embodiments, the second inverter line may be driven to HIGH through an n-channel transistor, or any other suitable transistor type. The n-channel or other suitable transistor type may be coupled to a power supply via a wired connection. In some embodiments, the second inverter line is coupled to the bit line. Application of the second voltage brings the second inverter line to HIGH. Furthermore, application of the second voltage causes the bit line to be brought to HIGH. The application of the second voltage to the second inverter line destroys a filament formation. In some embodiments, the filament destroyed via the application of the second voltage to the second voltage inverter line may be the filament formed via the application of the first voltage to the first inverter line, discussed supra.

Applying the second voltage to the second inverter line further provides a fourth voltage to an ovonic threshold switch (OTS) coupled with the bit line and the second inverter line. In some embodiments, the fourth voltage is greater than the second voltage. Additionally, the fourth voltage turns on the OTS coupled with the bit line and the second inverter line. The providing of the fourth voltage may cause a filament destruction. In some embodiments, the filament destroyed may be the filament formed via the providing of the third voltage, discussed supra.

Figure 6:
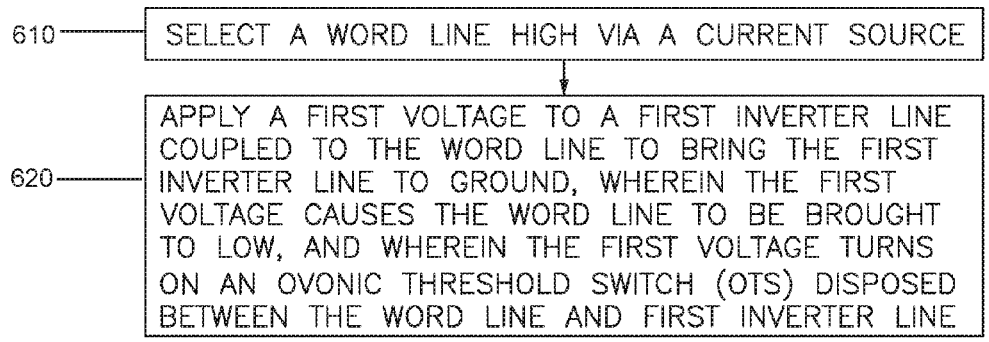
FIG. 6 schematically illustrates operations of a method for creating an inverter, according to one embodiment described herein.

FIG. 6 schematically illustrates operations of a method 600 for creating an inverter. The method 600 may be performed in conjunction with and/or utilizing the reversible tri-state memory device 200 and/or the circuit diagram of the bi-directional RRAM row and column decoder 300, discussed supra.

At operation 610, a word line is selected HIGH. In some embodiments, the word line may be selected HIGH via a current source.

At operation 620, a first voltage is applied to a first inverter line. The first inverter line is coupled to the word line. Application of the first voltage may bring the first inverter line to ground. Furthermore, the first voltage may cause the word line to be brought to LOW. The first voltage turns on an ovonic threshold switch (OTS) disposed between the word line and the first inverter line. The application of the first voltage to the first inverter line causes a filament formation. In certain embodiments, the filament is formed within a memory cell. The memory cell includes a Resistive Random Access Memory (RRAM) material. The RRAM material includes at least one of zinc oxide (ZnO), titanium oxide ($TiO_2$), hafnium oxide ($HfO_2$), tantalum oxide ($TaO_2$), vanadium oxide ($VO_2$), tungsten oxide ($WO_2$), zirconium oxide ($ZrO_2$), copper oxide, nickel oxide, or combinations and mixtures thereof.

Method 600 may also include selecting a bit line LOW. The selection of the bit line LOW may occur via an n-channel transistor. In some embodiments, however, the selection of the bit line LOW may occur via n p-channel transistor or any other suitable transistor type.

Method 600 may also include applying a second voltage to a second inverter line. In some embodiments, the second inverter line may be coupled to the bit line to actively drive the second inverter line to HIGH. In some embodiments, the second inverter line may be driven to HIGH via a p-channel transistor. In some embodiments, the p-channel transistor may be operatively connected to a power supply. In certain embodiments, the second inverter line may be driven to HIGH via an n-channel transistor or any other suitable type transistor. The second voltage may cause the bit line to be brought to HIGH. Furthermore, the second voltage may turn on the OTS. In some embodiments, the application of the second voltage to the second inverter line destroys a filament formation. In some embodiments, the application of the second voltage to the second inverter line may destroy the filament formed, as described supra.

Figure 7:
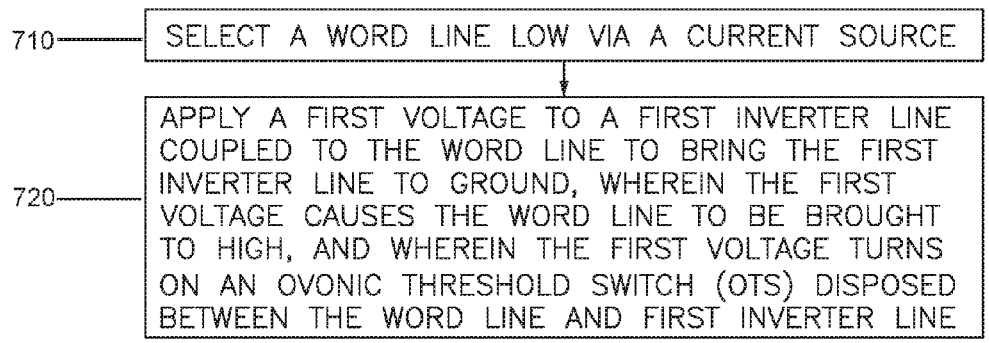
FIG. 7 schematically illustrates operations of a method for creating an inverter, according to one embodiment described herein.

FIG. 7 schematically illustrates operations of a method 700 for creating an inverter. The method 700 may be performed in conjunction with and/or utilizing the reversible tri-state memory device 200 and/or the circuit diagram of the bi-directional RRAM row and column decoder 300, discussed supra.

At operation 710, a word line is selected LOW. In some embodiments, the word line may be selected LOW via a current source.

At operation 720, a first voltage is applied to a first inverter line. The first inverter line is coupled to the word line. Application of the first voltage to the first inverter line brings the first inverter line to ground. Furthermore, the first voltage causes the word line to be brought to HIGH. Application of the first voltage also turns on an ovonic threshold switch (OTS). In some embodiments, the OTS is disposed between the word line and the first inverter line. Application of the first voltage to the first inverter line may cause the formation of a filament. In some embodiments, the filament may be formed within a memory cell. The memory cell may comprise a Resistive Random Access Memory (RRAM) material. The RRAM material may include at least one material selected from the group consisting of zinc oxide (ZnO), titanium oxide ($TiO_2$), hafnium oxide ($HfO_2$), tantalum oxide ($TaO_2$), vanadium oxide ($VO_2$), tungsten oxide ($WO_2$), zirconium oxide ($ZrO_2$), copper oxide, nickel oxide, or combinations and mixtures thereof.

Method 700 may also include selecting a bit line HIGH. The selection of the bit line HIGH may occur via n p-channel transistor, an n-channel transistor, or any other suitable transistor type.

Method 700 may also include applying a second voltage to a second inverter line. The second inverter line may be coupled to the bit line. Application of the second inverter line may actively drive the second inverter line to LOW. The driving of the second inverter line to LOW may occur via a transistor operatively connected to a power supply. Application of the second voltage may cause the bit line to be brought to LOW, and furthermore, in some embodiments, the application of the second voltage may turn on the OTS. Application of the second voltage to the second inverter line may destroy a filament formation. In some embodiments, the application of the second voltage to the second inverter line may destroy the filament formed, as described supra.

Benefits of the present disclosure include that the select voltage on the word and bit lines may be reversed for technologies such as RRAM requiring forward and reverse voltage across a memory cell. When a decoder deselects, the T1 drive transistor is off, and as such, the word line and bit line are each floating. However, the present disclosure provides a path from the deselect bias voltage through an OTS to the word line or the bit line. Untriggered, the OTS is a high value resistor which may serve as a high value keep-alive resistor.

Additional benefits of the present disclosure include a reduction in the integrated circuit chip size via a reduction in the area of the decoder driver which is placed on each of the four sides of the memory tile. A reduced layout is desirable to increase chip density and lower product cost. In exchange, an extra wire disposed along each of the four sides of the tile and an Ovonic Threshold Switch (OTS) element masked and deposited between the metal layers. The added mask may be made non-critical by placing it beyond array dummy cells (and surrounding the wire with dummy cells), which increases the number of wires on each side of the tile, yet avoids the much greater cost of an added critical mask step.

In summation, apparatus and methods relating to the fabrication of a reversible tri-state memory device which provides both forward and reverse write and read drive to a bi-directional RRAM cell, thus allowing writing in the forward and reverse directions. The memory device utilizes a single transistor "on pitch" which fits between two metal lines traversing the array tile.

While the foregoing is directed to embodiments of the present disclosure, other and further embodiments of the disclosure may be devised without departing from the basic scope thereof, and the scope thereof is determined by the claims that follow.

What is claimed is:

1. A method for creating an inverter, comprising:
   selecting a word line;
   applying a first voltage to a first inverter line to bring the first inverter line to ground, wherein the first voltage causes the word line to be brought to a first state;
   selecting a bit line corresponding to the first state; and
   applying a second voltage to a second inverter line to bring the second inverter line to a second state, wherein the second voltage causes the bit line to correspond to the second state, and wherein the first state is opposite to the second state, wherein at least one of i) the applying the first voltage to the first inverter line provides a third voltage to an ovonic threshold switch (OTS) coupled with the word line and the first inverter line or ii) applying the second voltage to the second inverter line provides a fourth voltage to an ovonic threshold switch (OTS) coupled with the bit line and the second inverter line.

2. The method of claim 1, wherein the first inverter line is coupled to the word line.

3. The method of claim 1, wherein the second inverter line is coupled to the bit line.

4. The method of claim 1, wherein the selecting the bit line corresponding to the first state is through an n-channel.

5. The method of claim 1, wherein the applying the first voltage to the first inverter line causes a filament formation.

6. The method of claim 5, wherein the applying the second voltage to the second inverter line destroys the filament formation.

7. The method of claim 5, wherein the filament formation is formed within a memory cell.

8. The method of claim 6, wherein the memory cell comprises a RRAM material selected from the group comprising:
   zinc oxide (ZnO), titanium oxide ($TiO_2$), hafnium oxide ($HfO_2$), tantalum oxide ($TaO_2$), vanadium oxide ($VO_2$), tungsten oxide ($WO_2$), zirconium oxide ($ZrO_2$), copper oxide, nickel oxide, or combinations and mixtures thereof.

9. A method for creating an inverter, comprising:
   selecting a word line;
   applying a first voltage to a first inverter line to bring the first inverter line to ground, wherein the first voltage causes the word line to be brought to a first state;
   selecting a bit line corresponding to the first state; and
   applying a second voltage to a second inverter line to bring the second inverter line to wherein the second voltage causes the bit line to correspond to the second state, and wherein the first state is opposite to the second state, where the applying the second voltage to the second inverter line includes: actively driving the second inverter line to the second state through a p-channel transistor.

10. The method of claim 9, wherein the p-channel transistor is coupled to a power supply via a wired connection.

11. A method for creating an inverter, comprising:
    selecting a word line;
    applying a first voltage to a first inverter line to bring the first inverter line to ground, wherein the first voltage causes the word line to be brought to a first state;
    selecting a bit line corresponding to the first state; and
    applying a second voltage to a second inverter line to bring the second inverter line to wherein the second voltage causes the bit line to correspond to the second state, and wherein the first state is opposite to the second state, wherein the applying the first voltage to the first inverter line provides a third voltage to an ovonic threshold switch (OTS) coupled with the word line and the first inverter line.

12. The method of claim 11, wherein the providing the third voltage causes a filament formation.

13. The method of claim 11, wherein the third voltage is greater than the first voltage.

14. The method of claim 11, wherein the third voltage turns on the OTS.

15. A method for creating an inverter, comprising:
    selecting a word line;
    applying a first voltage to a first inverter line to bring the first inverter line to ground, wherein the first voltage causes the word line to be brought to a first state;
    selecting a bit line corresponding to the first state; and
    applying a second voltage to a second inverter line to bring the second inverter line to wherein the second voltage causes the bit line to correspond to the second state, and wherein the first state is opposite to the second state, wherein the applying the second voltage to the second inverter line provides a fourth voltage to an ovonic threshold switch (OTS) coupled with the bit line and the second inverter line.

16. The method of claim 15, wherein the providing the fourth voltage causes a filament destruction.

17. The method of claim 15, wherein the fourth voltage is greater than the second voltage.

18. The method of claim 15, wherein the fourth voltage turns on the OTS.

* * * * *